(12) United States Patent
Ishizuka

(10) Patent No.: US 8,416,387 B2
(45) Date of Patent: Apr. 9, 2013

(54) WAVELENGTH SHIFT MEASURING APPARATUS, OPTICAL SOURCE APPARATUS, INTERFERENCE MEASURING APPARATUS, EXPOSURE APPARATUS, AND DEVICE MANUFACTURING METHOD

(75) Inventor: Ko Ishizuka, Saitama (JP)

(73) Assignee: Canon Kabushiki Kaisha (JP)

( * ) Notice: Subject to any disclaimer, the term of this patent is extended or adjusted under 35 U.S.C. 154(b) by 714 days.

(21) Appl. No.: 12/605,017

(22) Filed: Oct. 23, 2009

(65) Prior Publication Data

US 2010/0103403 A1 Apr. 29, 2010

(30) Foreign Application Priority Data

Oct. 24, 2008 (JP) .................................. 2008-274213
Sep. 28, 2009 (JP) .................................. 2009-223435

(51) Int. Cl.
| G03B 27/42 | (2006.01) |
| G03B 27/32 | (2006.01) |
| G03B 27/68 | (2006.01) |
| G03B 27/58 | (2006.01) |
| G03B 27/62 | (2006.01) |
| G01B 9/02 | (2006.01) |

(52) U.S. Cl. ................ 355/53; 355/52; 355/72; 355/75; 355/77; 356/521

(58) Field of Classification Search .................... 355/52, 355/53, 55, 72, 75, 77; 372/32; 356/450, 356/491, 496, 498–500, 521, 509, 494, 488
See application file for complete search history.

(56) References Cited

U.S. PATENT DOCUMENTS

| 4,815,850 A | * | 3/1989 | Kanayama et al. ........... 356/488 |
| 5,085,496 A | * | 2/1992 | Yoshida et al. ............... 359/569 |
| 5,124,994 A | * | 6/1992 | Leuchs et al. .................. 372/32 |

(Continued)

FOREIGN PATENT DOCUMENTS

| DE | 4429748 A1 | 3/1995 |
| JP | 01-238081 A | 9/1989 |

(Continued)

OTHER PUBLICATIONS

Partial European Search Report for corresponding EP 09173968.0, dated Mar. 27, 2012.

(Continued)

*Primary Examiner* — Toan Ton
*Assistant Examiner* — Christina Riddle
(74) *Attorney, Agent, or Firm* — Rossi, Kimms & McDowell LLP

(57) ABSTRACT

A wavelength shift measuring apparatus of the present invention is a wavelength shift detection sensor (WLCD1) which measures a shift of a wavelength of a light beam emitted from a light source, and includes a beam splitter (BS2) splitting the light beam emitted from the light source into a plurality of light beams and to synthesize two light beams among the plurality of light beams to generate an interference light, a spacer member (SP) provided so that an optical path length difference of the two light beams split by the beam splitter (PBS2) is constant, and a plurality of photoelectric sensors (PD) detecting the interference light generated by the beam splitter (BS2). The plurality of photoelectric sensors (PD) output a plurality of interference signals having phases shifted from one another based on the interference light to calculate a wavelength shift using the plurality of interference signals.

11 Claims, 7 Drawing Sheets

U.S. PATENT DOCUMENTS

| | | | | |
|---|---|---|---|---|
| 5,321,502 | A * | 6/1994 | Matsumoto et al. | 356/490 |
| 5,631,736 | A * | 5/1997 | Thiel et al. | 356/486 |
| 5,748,315 | A * | 5/1998 | Kawai et al. | 356/484 |
| 5,818,588 | A * | 10/1998 | Matsumoto et al. | 356/487 |
| 6,219,144 | B1 * | 4/2001 | Hill et al. | 356/487 |
| 6,717,682 | B2 * | 4/2004 | Kathman et al. | 356/521 |
| 2002/0171843 | A1 * | 11/2002 | Frankel | 356/491 |
| 2003/0164951 | A1 | 9/2003 | Deck | |
| 2004/0013430 | A1 * | 1/2004 | Asami et al. | 398/65 |
| 2006/0250618 | A1 * | 11/2006 | Kawasaki et al. | 356/512 |

FOREIGN PATENT DOCUMENTS

| | | |
|---|---|---|
| JP | 2002-319737 A | 10/2002 |
| JP | 2003-202203 A | 7/2003 |
| JP | 2006-010499 A | 1/2006 |

OTHER PUBLICATIONS

Extended European Search Report issued in counterpart application No. EP09173968.0, dated Jul. 20, 2012.

* cited by examiner

WAVELENGTH SHIFT MEASURING APPARATUS, OPTICAL SOURCE APPARATUS, INTERFERENCE MEASURING APPARATUS, EXPOSURE APPARATUS, AND DEVICE MANUFACTURING METHOD

BACKGROUND OF THE INVENTION

1. Field of the Invention

The present invention relates to a wavelength shift measuring apparatus capable of measuring a shift of a light source wavelength by being configured so that an optical path length difference of two light beams is constant.

2. Description of the Related Art

Conventionally, an interferometer has been used as a measuring apparatus for measuring a relative displacement or a refractive index of a machine stage. The interferometer generally measures with reference to a wavelength. Therefore, when a wavelength of the light source shifts, a measurement error is generated.

In this regard, conventionally, either (1) or (2) method has been used, i.e. (1) a configuration where an optical path length difference is set to zero is adopted so as not to generate an error caused by a light source wavelength shift in principle, or (2) a wavelength stabilization laser is used for suppressing a measurement error.

However, for example in order to suppress a measurement error in an interference measuring apparatus where an optical path length difference can not be set to zero for the intended use, there is no other way than to stabilize a wavelength. For example, Japanese Patent Laid-open No. 2002-319737 describes an optical communication light source where a wavelength stabilizing function is embedded. However, as described in Japanese Patent Laid-open No. 2003-202203, because the wavelength stabilization laser is expensive, the measuring apparatus can not be configured at low cost.

Japanese Patent Laid-open No. 2006-010499 discloses a configuration where a tilt is given to the optical path length difference by a wedge plate or the like and an interference pattern is generated by the interference of reflected lights on front and back surfaces. Further, it discloses that a light receiving element is disposed considering a bright and dark distribution of the interference pattern and that change of the bright and dark positions in accordance with the wavelength shift is detected by the fixed light receiving element. Japanese Patent Laid-open No. 2006-010499 proposes that the wavelength shift is detected with high resolution by the configuration.

However, commonly, a thickness of the wedge plate can not be accurate in a size around a wavelength. Therefore, the adjustment and the installation is necessary so as to be able to perform the most sensitive detection of the change of the bright and dark in accordance with the relation between the positions of the light receiving element and the interference pattern. On the other hand, such areas may be displaced in accordance with an external environment (temperature variation, application of vibration, or the like), and further stable method is necessary. In the wedge plate made of a glass or the like, because the optical path length difference of the front and back surfaces varies by the influence of heat expansion, a method for reducing the influence is also a problem.

BRIEF SUMMARY OF THE INVENTION

The present invention includes a configuration where an optical path length difference of two light beams is constant, and is configured so that a phase of an interference signal is not influenced by elements other than a wavelength shift (temperature, humidity, vibration, or the like). Therefore, an inexpensive and highly-accurate wavelength shift measuring apparatus which is capable of stably accurately measuring a shift of a light source wavelength, a light source apparatus, an interference measuring apparatus, an exposure apparatus, and a device manufacturing method using the wavelength shift measuring apparatus can be provided.

A wavelength shift measuring apparatus as one aspect of the present invention measures a shift of a wavelength of a light beam emitted from a light source. The wavelength shift measuring apparatus includes an optical element configured to split the light beam emitted from the light source into a plurality of light beams and to synthesize two light beams among the plurality of light beams to generate an interference light, a spacer member provided so that an optical path length difference of the two light beams split by the optical element is constant, and a plurality of photoelectric sensors configured to detect the interference light generated by the optical element. The plurality of photoelectric sensors output a plurality of interference signals which have phases shifted from one another based on the interference light to calculate a wavelength shift using the plurality of interference signals.

A light source apparatus as another aspect of the present invention emits a coherent light beam. The light source apparatus includes a light source configured to emit the light beam, a light beam splitting portion configured to split the light beam emitted from the light source, the wavelength shift measuring apparatus configured to receive a part of a light beam split by the light beam splitting portion and output a plurality of interference signals based on the light beam, and a controller configured to control a driving current and a temperature of the light source so as to suppress a wavelength shift of the light beam emitted from the light source, based on the plurality of interference signals outputted from the wavelength shift measuring apparatus.

An interference measuring apparatus as another aspect of the present invention measures a displacement of an object to be measured. The interference measuring apparatus includes a light source configured to emit a coherent light beam, an interference measuring portion configured to receive a part of the light beam emitted from the light source to measure the displacement of the object to be measured, the wavelength shift measuring apparatus configured to receive the other part of the light beam emitted from the light source to output a plurality of interference signals based on the light beam, a wavelength shift calculating portion configured to calculate a shift of a wavelength of the light beam, based on the plurality of interference signals outputted from the wavelength shift measuring apparatus, and a displacement correcting portion configured to correct the displacement of the object to be measured which has been measured by the interference measuring portion using the shift of the wavelength calculated by the wavelength shift calculating portion.

An exposure apparatus as another aspect of the present invention exposes a pattern of an original plate onto a substrate. The exposure apparatus includes an illumination optical system configured to illuminate the pattern of the original plate, a projection optical system configured to project the pattern of the original plate onto the substrate, a first stage configured to move while mounting the original plate, a second stage configured to move while mounting the substrate, and an interference measuring apparatus according to claim 6, the interference measuring apparatus being configured to measure at least one of positions of the first and second stages.

A device manufacturing method as another aspect of the present invention includes the steps of exposing the substrate using an exposure apparatus, and developing the exposed substrate.

Further features and aspects of the present invention will become apparent from the following description of exemplary embodiments with reference to the attached drawings.

DETAILED DESCRIPTION OF THE PREFERRED EMBODIMENTS

Figure 1:
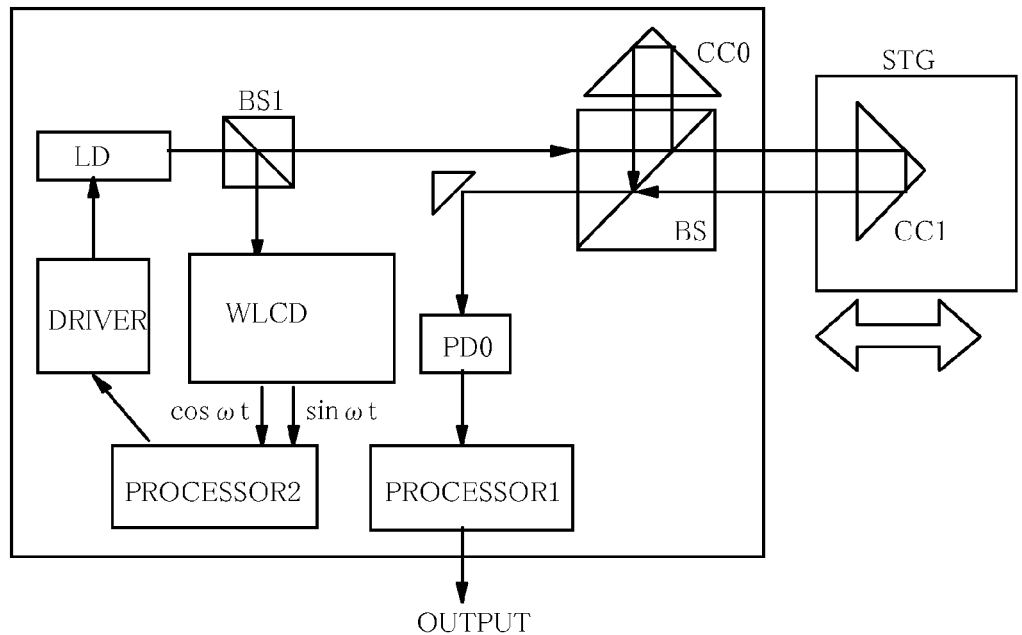
FIG. 1 is a block diagram of an interference measuring apparatus in the present embodiment.

Exemplary embodiments of the present invention will be described below with reference to the accompanied drawings. In each of the drawings, the same elements will be denoted by the same reference numerals and the duplicate descriptions thereof will be omitted.

First, a configuration of an interference measuring apparatus of the present embodiment will be described. FIG. 1 is a block diagram of an interference measuring apparatus of the present embodiment.

A light source LD emits a coherent light beam. A part of the light beam that has emitted from the light source LD and has entered a beam splitter BS1 transmits through the beam splitter BS1 and is guided to a main interference measuring apparatus (interferometer) for measuring a position of an object to be measured. The main interference measuring apparatus is an interference measuring portion which receives a part of the light beam emitted from the light source LD to measure a displacement of the object to be measured.

As shown in FIG. 1, the main interference measuring apparatus (interference measuring portion) in the present embodiment includes a beam splitter BS, corner cubes CC0 and CC1, a photoelectric sensor PD0 (photodetector), and an arithmetic unit PROCESSOR1.

The interference measuring apparatus measures a displacement (position) of the corner cube CC1 (object to be measured) which is fixedly disposed on a stage STG relatively moving in an arrow direction in FIG. 1. Such an interference measuring apparatus is used for measuring a displacement or a refractive index of the object to be measured, or the like, and is also configured, for example, as a Fizeau interferometer or a Mach-Zehnder interferometer other than a Michelson interferometer as shown in FIG. 1.

In the interference measuring apparatus, a part of an incident light beam which has entered the beam splitter BS is reflected by the beam splitter BS to enter the corner cube CC0. On the other hand, the other part of the incident light beam transmits through the beam splitter BS to enter the corner cube CC1 disposed on the movable stage STG. Two light beams from the corner cubes CC0 and CC1 are synthesized by the beam splitter BS to be converted into an electric signal via the photoelectric sensor PD0. An output signal from the photoelectric sensor PD0 is inputted to the arithmetic unit PROCESSOR1 by which a displacement of the stage STG is calculated.

The main interference measuring apparatus is not limited to the configuration shown in FIG. 1, but can be appropriately modified in accordance with the intended use.

The other part of the light beam which has emitted from the light source LD and has entered the beam splitter BS1 is reflected by the beam splitter BS1. The reflected light beam is guided to a wavelength shift detection sensor WLCD. Thus, the beam splitter BS1 functions as a light beam splitting portion which splits the light beam emitted from the light source LD.

The wavelength shift detection sensor WLCD detects a relative shift with respect to an initial value of a light source wavelength (a wavelength of a light beam emitted from the light source LD). Thus, the wavelength shift detection sensor WLCD is a wavelength shift measuring apparatus which receives the other part of the light beam emitted from the light source LD to output an interference phase shift signal of the light beam (interference signal).

The wavelength shift detection sensor WLCD is constituted of an interference phase measuring optical system and is configured to output a plurality of interference signals. The plurality of interference signals outputted from the wavelength shift detection sensor WLCD are guided to a subsequent arithmetic unit PROCESSOR2, and a wavelength shift is calculated by the arithmetic unit PROCESSOR2. The arithmetic unit PROCESSOR2 may also be included in the wavelength shift detection sensor WLCD.

An interference measuring apparatus shown in FIG. 1 feeds back the wavelength shift to a controlling portion of a driving current or a temperature of the light source LD, a position controlling portion of a diffraction grating or a mirror inside the light source, or the like to perform a control so that the wavelength shift keeps an original value (so that the wavelength shift is reduced). Specifically, in order to perform the feedback control as described above, the driving portion DRIVER controls a motion of the light source LD based on an output signal from the arithmetic unit PROCESSOR2.

Thus, the interference measuring apparatus has a controller which controls the driving current and the temperature of the light source LD so that the wavelength shift of the light source emitted from the light source LD is suppressed based on the interference phase shift signal outputted from the wavelength shift measuring apparatus WLCD. In the embodiment, the controller includes the arithmetic unit PROCESSOR2 and the driving portion DRIVER.

In the interference measuring apparatus shown in FIG. 1, the light source LD, the beam splitter BS1, the wavelength shift measuring apparatus WLCD, the arithmetic unit PROCESSOR2, and the driving portion DRIVER functions as a light source apparatus.

Thus, in the interference measuring apparatus shown in FIG. 1, the wavelength shift detection sensor WLCD detects the wavelength shift of the light source LD and the arithmetic unit PROCESSOR2 and the driving portion DRIVER control the motion of the light source LD so that the wavelength shift is reduced. The generation of the wavelength shift of the light beam emitted from the light source LD can be suppressed by such a control and the light source wavelength can be stabilized.

Figure 2:
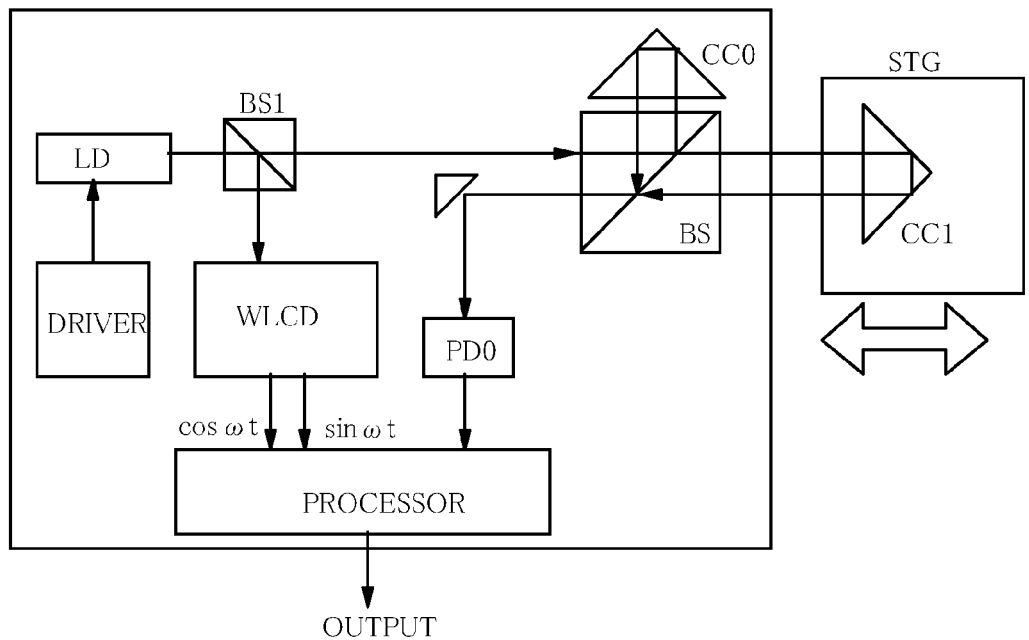
FIG. 2 is a block diagram of another interference measuring apparatus in the present embodiment.

Next, the configuration of another interference measuring apparatus in the present embodiment will be described. FIG. 2 is a block diagram of another interference measuring apparatus of the present embodiment.

The interference measuring apparatus shown in FIG. 2 outputs the interference phase shift signal from the wavelength shift detection sensor WLCD as light source wavelength information to a subsequent arithmetic unit PROCESSOR. The arithmetic unit PROCESSOR includes a wavelength shift calculating portion which calculates a shift of the wavelength of the light beam based on the interference phase shift signal outputted from the wavelength shift detection sensor WLCD.

The arithmetic unit PROCESSOR calculates a relative displacement of an object to be measured based on the interference signal (for example, change of an interference pattern, information of an interference phase, and latest information of the wavelength) which is obtained by the main interference measuring apparatus (interference measuring portion). Further, the arithmetic unit PROCESSOR is provided with a displacement correcting portion. The displacement correcting portion corrects a displacement of the object to be measured which has been measured by the main interference measuring apparatus (interference measuring portion) using the shift of the wavelength calculated by the wavelength shift calculating portion.

Functions of the arithmetic unit PROCESSOR shown in FIG. 2 can be included in an upper apparatus of the interference measuring apparatus. In this case, for example, arithmetic wavelength information, a count value of an interference pattern, and phase information are outputted from the arithmetic unit PROCESSOR.

Next, the configuration of the wavelength shift detection sensor provided in the interference measuring apparatus of the present embodiment will be described in detail.

[Embodiment 1]

First, a wavelength shift detection sensor in Embodiment 1 will be described.

Figure 3:
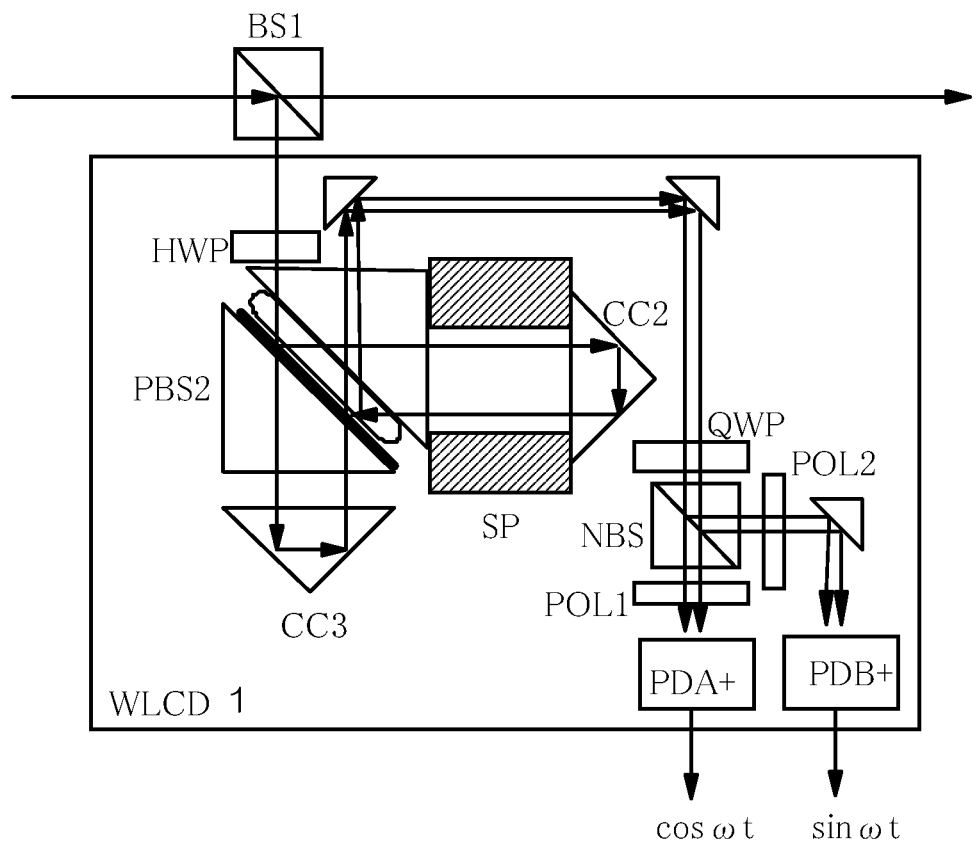
FIG. 3 is a configuration diagram of a wavelength shift detection sensor WLCD1 (wavelength shift measuring apparatus) in Embodiment 1.

FIG. 3 is a configuration diagram of a wavelength shift detection sensor WLCD1 in the present embodiment. The wavelength shift detection sensor WLCD1 (wavelength shift measuring apparatus) shown in FIG. 3 is constituted by using a polarization beam splitter.

The wavelength shift detection sensor WLCD1 includes a half wavelength plate HWP, a polarization beam splitter PBS2, corner cubes CC2 and CC3, and a quarter wavelength plate QWP, a non-polarization beam splitter NBS, a polarization plate POL1, and a polarization plate POL2 as optical elements. Further, it includes a spacer member SP, a photoelectric sensor PDA+, and a photoelectric sensor PDB+.

A polarization plane of the light beam reflected by the beam splitter BS1 is appropriately rotated by the half wavelength plate HWP in accordance with a state of a direction of a linear polarization to set the polarization plane to 45 degrees direction to enter the polarization beam splitter PBS2. The incident light beam which has entered the polarization beam splitter PBS2 is split into two light beams constituted of reflected light of S-polarization and transmitted light of P-polarization.

The reflected light of S-polarization enters the corner cube CC2, and the transmitted light of P-polarization enters the corner cube CC3.

The two light beams that have entered the corner cubes CC2 and CC3 are reflected by the corner cubes CC2 and CC3 to enter the polarization beam splitter PBS2 again to be synthesized. Thus, the polarization beam splitter PBS2 splits the light beam emitted from the light source into two light beams to synthesize the two light beams. Although the two light beams are not so-called interference light because they have polarization planes orthogonal to each other, after the light beams transmit through the quarter wavelength plate QWP, they are converted into linear polarization light beams which change the directions of the polarization planes in accordance with the phase difference between the light beams to be split into homogeneous two light beams by the non-polarization beam splitter NBS. Bright and dark timings are provided to the transmitted light by the polarization plate POL1, and the transmitted light enters a photoelectric element PDA+ as a cosine signal light (A-phase signal). On the other hand, bright and dark timings are provided to the reflected light by the polarization plate POL2, and the reflected light enters a photoelectric element PDB+ as a sine signal light (B-phase signal).

In the present embodiment, a spacer member SP is provided so that an optical path length difference of the two light beams split by the polarization beam splitter PBS2 is constant. Specifically, the spacer member SP holds the interval between the beam splitter BS2 and the corner cube CC2.

A plurality of photoelectric sensors PDA+ and PDB+ output interference phase shift signals (interference signals) based on the incident interference lights. The phases of the interference signals are shifted by 90 degrees each other. The interference phase shift signals are inputted to an arithmetic unit (not shown), and a wavelength shift is calculated. The arithmetic unit performs an arctangent calculation ($\tan^{-1}$) using the A-phase signal and the B-phase signal to calculate an interference phase $\phi$. When the interference phase $\phi$ is continuously measured, the shift of the interference phase $\phi$ can be obtained. Therefore, the shift of the light source wavelength can be measured.

In the wavelength shift detection sensor WLCD1 of the present embodiment, the beam splitter BS2 and the corner cubes CC2 and CC3 are configured so that an optical path length difference of two light beams is given using the stable spacer member SP. Generally, when an optical path length difference is $L_0$ [nm], an initial wavelength of a light source is $\lambda_0$ [nm], and a wavelength shift is $\Delta\lambda$ [nm], a phase shift $\Delta\phi$ [rad] is represented as expression (1).

$$\Delta\phi = 2\pi \times L_0 \times \{1/\lambda_0 - 1/(\lambda_0 + \Delta\lambda)\} \tag{1}$$

When the expression (1) is deformed to be approximated as $\Delta\lambda \ll \lambda_0$, the expression (1) is represented as expression (1').

$$\Delta\lambda = (\Delta\phi \times \lambda_0^2)/(2\pi \times L_0) \tag{1'}$$

In the expression (1'), substituting 10000 μm as $L_0$, 1/4096 as $\Delta\phi/2\pi$, and 0.85 μm as $\lambda_0$ into the expression (1'), $\Delta\lambda$ is 0.017 μm. The reference code $\Delta\lambda$ corresponds to a wavelength shift detection resolution. In other words, the detection can be performed on the relation of "a wavelength shift of 0.017 pm per a phase shift of $(1/4096) \times 2\pi$".

As described above, according to the wavelength shift measuring apparatus of the present embodiment, because a stable spacer member is used so that the optical path length difference of two light beams is held to be constant, a wavelength shift of the light source can be measured with high accuracy. Further, an internal space of the spacer is preferably set to be in a vacuum state or to be filled with dry air in order to remove humidity dependency.

[Embodiment 2]

Next, a wavelength shift detection sensor in Embodiment 2 of the present invention will be described.

Figure 4:
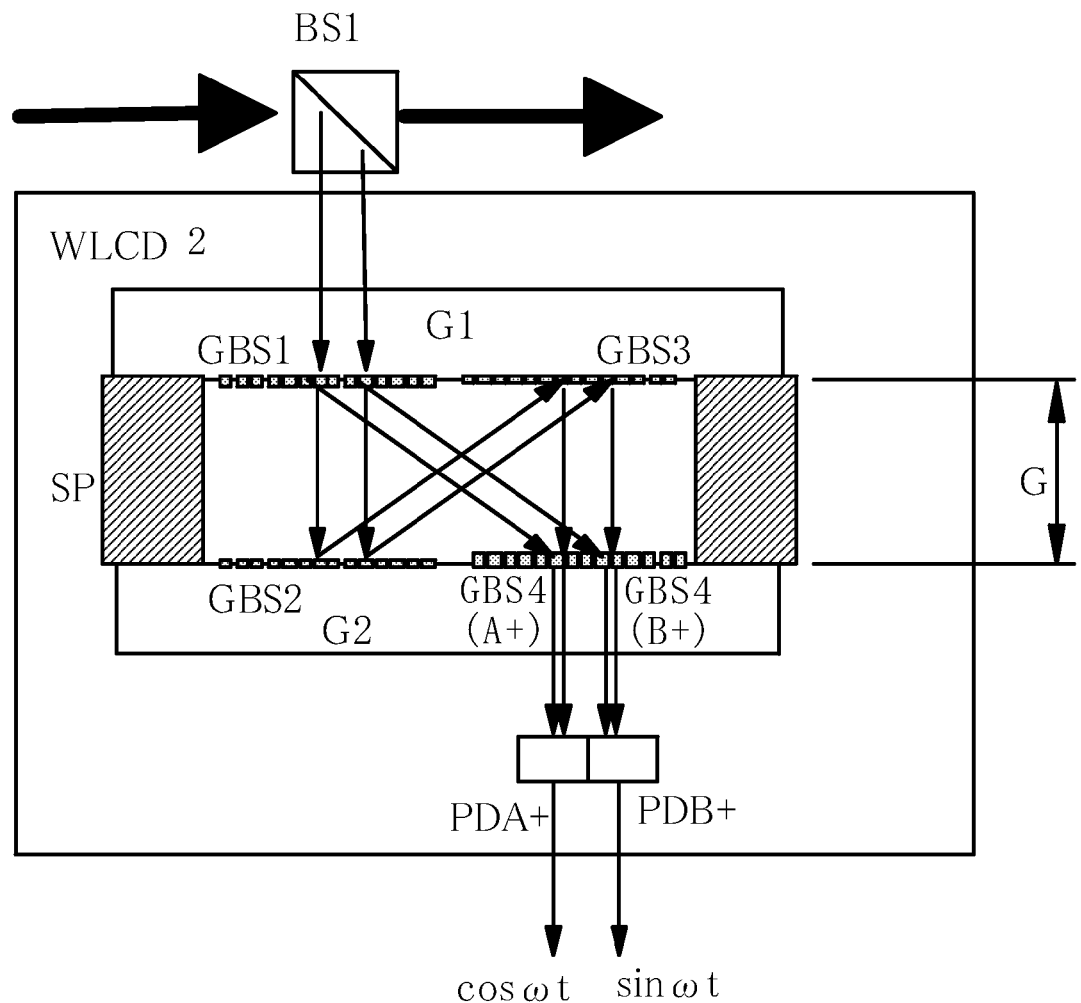
FIG. 4 is a configuration diagram of a wavelength shift detection sensor WLCD2 (wavelength shift measuring apparatus) in Embodiment 2.

FIG. 4 is a configuration diagram of a wavelength shift detection sensor WLCD2 (wavelength shift measuring apparatus) in the present embodiment. In the wavelength shift detection sensor WLCD2 (wavelength shift measuring apparatus) shown in FIG. 4, a spacer member SP is held between two diffraction grating plates (glass substrates G1 and G2: transmissive substrate). Thus, the spacer member SP that is a reference of an optical path length difference of the two light beams is used so as to constitute a wavelength shift detection sensor of a Mach-Zehnder interferometer which forms the optical path length difference of the two light beams.

The wavelength shift detection sensor WLCD2 shown in FIG. 4 is provided with a transmissive diffraction grating GBS1 and a reflective diffraction grating GBS3 (collectively, a "first diffraction grating") on a back surface of a glass substrate G1 (first diffraction grating plate) as an optical element. A glass substrate G2 (second diffraction grating plate) as an optical element is arranged so as to face the glass substrate G1 at a distance of an interval (a gap G) formed by the spacer member SP. The glass substrate G2 is provided with a reflective diffraction grating GBS2 and a transmissive diffraction grating GBS4 (collectively, a "second diffraction grating").

The spacer member SP holds the interval (the gap G) between the glass substrate G1 and the glass substrate G2 so that the optical path length difference of the two light beams is constant. In the present embodiment, for example the gap G is set to between 5 to 10 mm, but is not limited to this.

The spacer member SP is preferably formed using a low-expansion material. For example, when a spacer member SP having a gap G of 10 mm using a low-expansion material having characteristics of 0.1 ppm/degree Celsius is formed, the optical path length difference is 20 mm and varies 2 nm by a temperature variation of 1 degree Celsius. In the same condition, when a low-expansion material having characteristics of for example 0.02 ppm/degree Celsius is used, the variation of the optical path length difference can be further suppressed. In this case, a control is preferably performed so that a temperature is kept to be constant, for example the temperature variation is in a range of 0.1 degree Celsius. As described in the present embodiment, an optical system which is formed by holding both sides of the spacer member SP between the diffraction gratings is extremely stable because a thermal expansion of a material of the spacer member SP has only to be considered.

The light beam that has been reflected by the beam splitter BS1 to enter the glass substrate G1 is separated into zero-order and first-order lights and other lights by the diffraction grating GBS1.

A reflection and a first-order diffraction of zero-order light of the diffraction grating GBS1 are performed by the diffraction grating GBS2 on an upper surface of the glass substrate G2, and a reflection and a minus first-order diffraction of the light are performed by the diffraction grating GBS3 on an lower surface of the glass substrate G1. The light enters the diffraction grating GBS4 on the upper surface of the glass substrate G2 and transmits through the diffraction grating GBS4 as zero-order light.

On the other hand, a transmission and a first-order diffraction of first-order light of the diffraction grating GBS1 are performed by the diffraction grating GBS4 on an upper surface of the glass substrate G2, and the light transmits through the diffraction grating GBS4.

Two light beams transmitted trough and synthesized by the diffraction grating GBS4 interfere with each other and enter a plurality of photoelectric sensors PD (photodetectors). For example, two photoelectric sensors PDA+ and PDB+ are shown in FIG. 4. The photoelectric sensor PD outputs an interference phase shift of the light beam based on the interference light.

Figure 5:
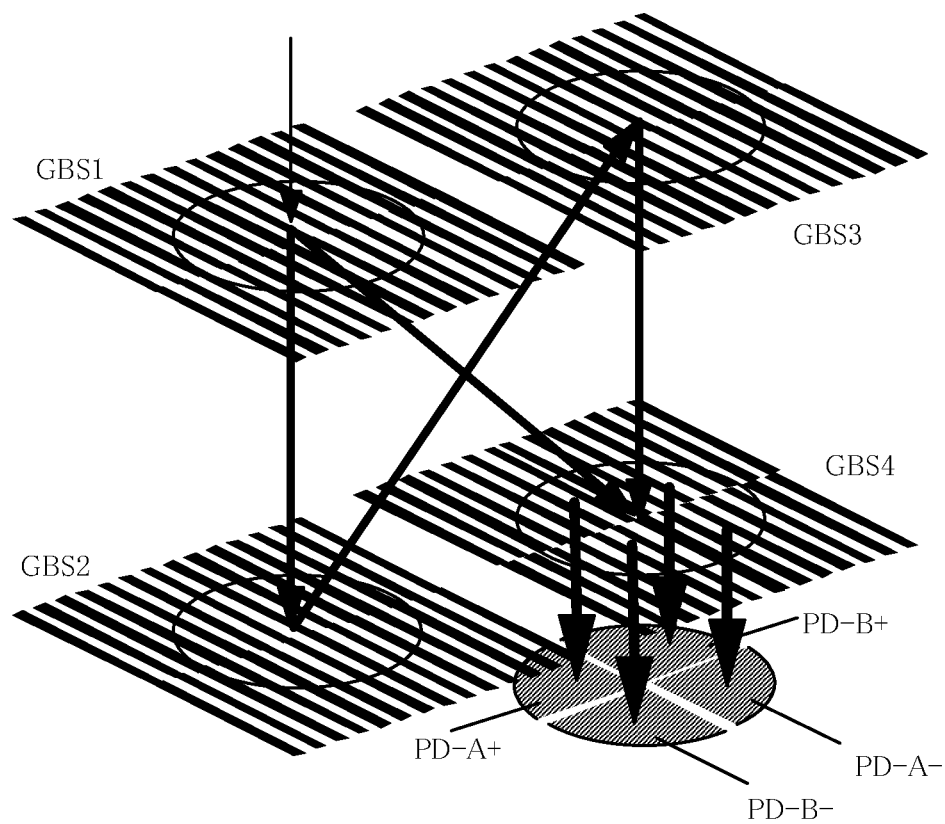
FIG. 5 is a configuration diagram of diffraction gratings GBS1 to GBS4 and a photoelectric sensor PD in Embodiment 2.
Figure 6:
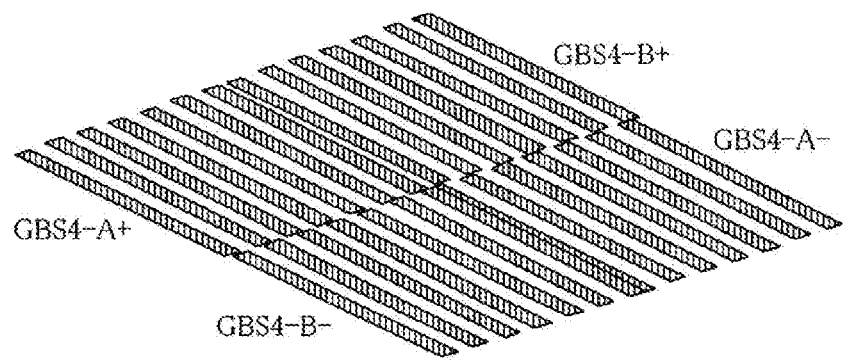
FIG. 6 is a configuration diagram of a diffraction grating GBS4 in Embodiment 2.

Next, configurations of the diffraction grating GBS4 and the photoelectric sensor PD will be described in detail. FIG. 5 is a configuration diagram of the diffraction gratings GBS1 to GBS4 and the photoelectric sensor PD in the present embodiment. FIG. 6 is a configuration diagram of the diffraction grating GBS4 in the present embodiment.

As shown in FIG. 6, the diffraction grating GBS4 includes four regions GBS4-A+, GBS4-B+, GBS4-A−, and GBS4-B−. Each diffraction grating is arranged at a position with a relative shift by ¼ pitch for each of the four regions. The regions GBS4-A+ and GBS4-A− are configured to have phases opposite to each other, and the regions GBS4-B+ and GBS4-B− are also configured to have phases opposite to each other. The regions GBS4-A+ and GBS4-B+ are configured to have a shift from each other by ¼ pitch.

First-order diffracted light entered from the diffraction grating GBS1 changes a position of its wavefront in accordance with a position of the grating when first-order diffraction is performed on each of the four regions of the diffraction grating GBS4. Therefore, wavefront phases of the first-order diffracted lights emitted from the regions of the diffracted grating GBS4 have phases shifted from one another by 90 degrees. On the other hand, because the light beam entered from the diffraction grating GBS3 transmits through the diffraction grating GBS4 without change, any specific action does not occur and its optical path is overlapped with that of the light beam entered from the diffraction grating GBS1. Thus, the two light beams entered from the diffraction gratings GBS1 and GBS3 interfere with each other.

The photoelectric sensor PD shown in FIG. 5 includes four regions PD-A+, PD-B+, PD-A−, and PD-B−. Each region of the photoelectric sensor PD is arranged so as to correspond to each of the four regions of the diffraction grating GBS4. Therefore, sine-wave signals having phases different from one another by 90 degrees are outputted from output portions of the four regions PD-A+, PD-B+, PD-A−, and PD-B−.

An arithmetic unit of the interference measuring apparatus generates an A-phase signal and a B-phase signal based on the four phase difference signals outputted from the photoelectric sensor PD. The A-phase signal is a differential signal of the output signal from the two regions PD-A+ and PD-A− of the photoelectric sensor PD. The B-phase signal is a differential signal of the output signals from the other two regions PD-B+ and PD-B− of the photoelectric sensor PD.

The arithmetic unit performs an arctangent calculation ($\tan^{-1}$) using the A-phase signal and the B-phase signal to calculate an interference phase $\phi$. A shift of the interference phase $\phi$ can be obtained by continuous measurement of the interference phase $\phi$. Therefore, a shift of the light source wavelength can be measured.

In the wavelength shift detection sensor WLCD2 shown in FIG. 4, similarly to the case of the wavelength shift detection sensor WLCD1 of FIG. 3, the phase shift $\Delta\phi$ and the wavelength shift $\Delta\lambda$ are represented by the expressions (1) and (1'), respectively. When the optical path length difference $L_0$ is 10000 μm, the phase shift $\Delta\phi/2\pi$ is 1/4096, and the initial wavelength of the light source Δλ is 0.85 μm, the wavelength shift Δλ corresponding to the wavelength shift detection resolution is 0.017 pm.

In the wavelength shift detection sensor WLCD2, grating pitches of the diffraction gratings GBS1, GBS2, GBS3, and GBS4 are set to be the same value. These diffraction gratings have only to have a function of transmission or reflection.

As shown in FIG. 4, an optical path where the diffracted light of the diffraction grating GBS1 reaches the diffraction grating GBS4 is only a part where a light beam obliquely proceeds in the gap G formed by the spacer member SP. On the other hand, an optical path where the light beam transmitted through the diffraction grating GBS1 by zero-order transmission reaches the diffraction grating GBS4 is a part which is opposite in an upward and downward direction and has a length similar to the optical path where a light beam obliquely proceeds in the gap G, and a part where the light beam perpendicularly passes through the gap G twice. Therefore, the optical path length difference of the two light beams corresponds to a length twice as long as the gap G, and it is an extremely simple configuration. For example, when the length of the gap G is set to 5 mm, the optical path length difference of the two light beams is 10 mm.

The gap G is configured to hold both sides of the low-expansion spacer member SP between the glass substrates G1 and G2. Therefore, there are a few components and the configuration is simple, any adhesives are not necessary, and an overall configuration of the wavelength shift detection sensor WLCD2 is extremely stable. A region of the gap G is filled with dry air or the like instead of a glass member. Therefore, there is a little possibility that the length of the gap G changes with the passage of time.

As described above, the wavelength shift detection sensor WLCD2 shown in FIG. 4 is superior to the wavelength shift detection sensor WLCD1 of FIG. 3. When focused only on a wavelength shift instead of an absolute value of a light source wavelength, the accuracy of the gap G of the spacer member SP is not important.

In the wavelength shift detection sensor WLCD2, as a method for providing a phase difference, a wavefront splitting is performed to split the diffraction grating GBS4 into four regions. However, the present invention is not limited to this, and the number of the splitting may be, for example two or three. Because one-order diffracted light shifts a phase of its wavefront in accordance with the position of the diffraction grating, a similar effect can also be obtained by performing the wavefront splitting of any one of the diffraction gratings GBS1, GBS2, and GBS3.

Figure 7:
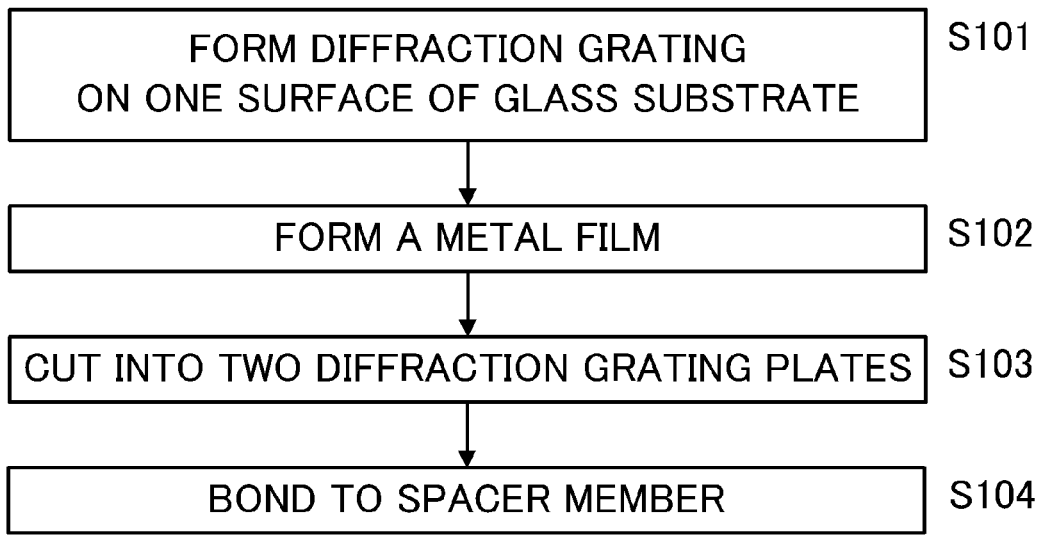
FIG. 7 is a flow of a method for manufacturing a wavelength shift detection sensor in Embodiment 2.

Next, a method for manufacturing the wavelength shift detection sensor in the present embodiment will be described. FIG. 7 is a flow of the method for manufacturing the wavelength shift detection sensor in the present embodiment.

First, in Step S101, a resist is applied onto one surface of a transmissive substrate (a glass substrate), and an exposure is performed for obtaining diffraction grating patterns with a pitch of around 2 μm by using a semiconductor exposure apparatus. Subsequently, the diffraction grating pattern (transmissive) is formed via developing and etching processes.

Next, in Step S102, a metal film such as aluminum is formed at an area where light is to be reflected and diffracted. Commonly, aluminum is evaporated on a whole area, and only a transmissive area is removed by etching in a photolithography process.

In Step S103, the transmissive substrate (glass substrate) on which the diffraction grating pattern is formed is cut into two diffraction grating plates, each of which has a size of around 5 mm×10 mm. In Step S104, the cut two diffraction grating plates are bonded to both sides of the spacer member SP having a frame shape with a thickness of around 5 mm in a state where its inside is a diffraction grating pattern surface.

In this case, an angle alignment of the two diffraction grating plates in a mutual azimuth direction is performed, and they are bonded while the contrast of the interference signal is adjusted to be improved. When the diffraction grating plate is bonded, adhesive with low moisture absorption and extremely low expansion is preferably adopted.

When a space closed by the spacer member SP and the diffraction grating is connected to an outside, because of the atmospheric pressure variation, humidity variation, or the like, an error may be caused by the change of the density, the refractive index, or the like. Therefore, it is preferable that an exhaust hole portion provided on the spacer member SP is sealed after the air in the space has been exhausted to keep the space in a state closer to a vacuum state or to inject dry air. The wavelength shift detection sensor can also be constituted without using the spacer member SP.

Figure 8:
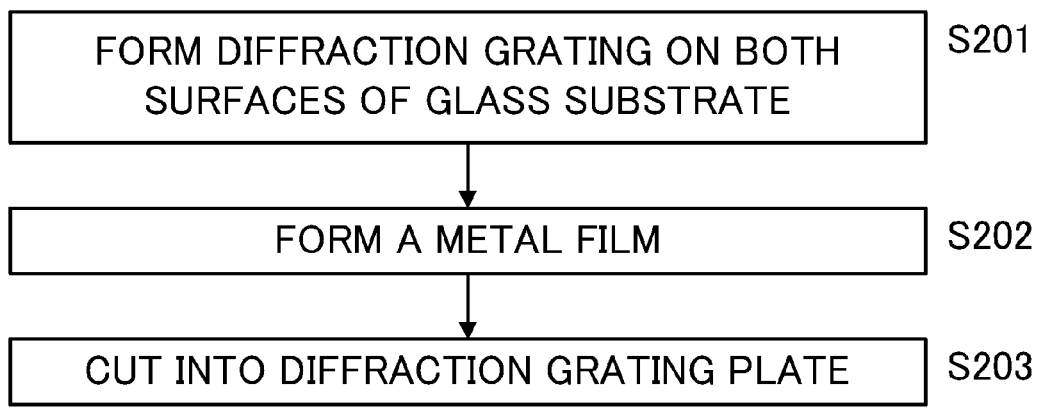
FIG. 8 is a flow of a method for manufacturing another wavelength shift detection sensor in Embodiment 2.

FIG. 8 is a flow of a method for manufacturing another wavelength shift detection sensor in the present embodiment. The flow of FIG. 8 shows a method for forming a diffraction grating on both sides of a glass substrate without using the spacer member SP.

First, in Step S201, a resist is applied onto both surfaces of a thick transmissive substrate (glass substrate) and an exposure is performed for forming diffraction grating patterns with a pitch of around 2 μm by using a semiconductor exposure apparatus. Subsequently, the diffraction grating pattern (transmissive) is formed via developing and etching processes.

Next, in Step S202, a metal film such as aluminum is formed at an area where light is to be reflected and diffracted. Commonly, aluminum is evaporated on a whole area, and only a transmissive area is removed by etching in a photolithography process. In Step S203, a transmissive substrate on which the diffraction grating pattern is formed is cut into parts, each of which has a size of around 5 mm×10 mm to use it as a diffraction grating plate.

When a diffraction grating plate is formed without using the spacer member SP, instead of a method shown in FIG. 8, a diffraction grating pattern may be formed on one surface of two transmissive substrates to bond them back to back.

Because a material that provides an optical path length difference is a transmissive substrate such as a quartz glass, a low-expansion material (quartz) itself may be deteriorated. Therefore, a compensation of a reference optical path length is preferably performed by a temperature measurement.

According to the method for manufacturing the wavelength shift measuring apparatus (diffraction grating plate) in the present embodiment, because an optical system is formed at both sides of the glass substrate, a good shape stability and reliability can be obtained.

As described above, according to the wavelength shift measuring apparatus of the present embodiment, because the optical path length difference of two light beams is held so as to be constant, a wavelength shift of a light source can be measured with high accuracy.

[Embodiment 3]

Next, a wavelength shift measuring apparatus in Embodiment 3 of the present invention will be described.

Figure 9:
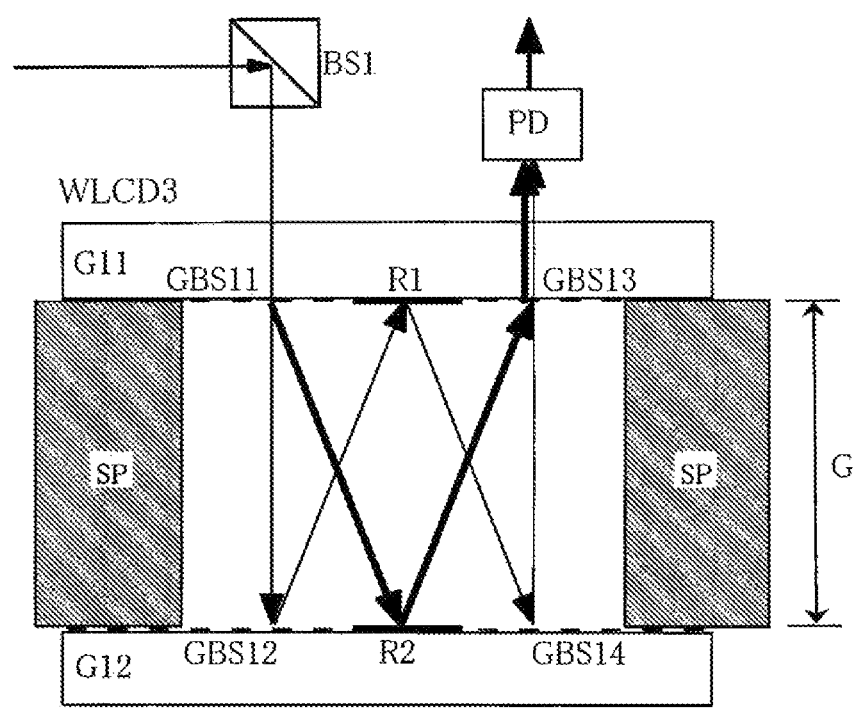
FIG. 9 is a configuration diagram of a wavelength shift detection sensor WLCD3 (wavelength shift measuring apparatus) in Embodiment 3.

FIG. 9 is a configuration diagram of a wavelength shift detection sensor WLCD3 (wavelength shift measuring apparatus) in the present embodiment. The wavelength shift detection sensor WLCD3 (wavelength shift measuring apparatus)

shown in FIG. 9 is configured to hold a spacer member SP between two diffraction grating plates (glass substrates G3 and G4).

The wavelength shift detection sensor WLCD3 is provided with two diffraction gratings GBS11 and GBS13 (first diffraction grating) and a reflective element R1 (first reflective element) on a glass substrate G11 (first diffraction grating plate) as an optical element. Similarly, two diffraction gratings GBS12 and GBS14 (second diffraction grating) and a reflective element R2 (second reflective element) are provided on a glass substrate G12 (second diffraction grating plate) as an optical element.

In the wavelength shift detection sensor WLCD3, the functions of the diffraction gratings GBS11 to GBS14 are similar to those of the diffraction gratings GBS1 to GBS4 of Embodiment 2. However, the glass substrates G11 and G12 in Embodiment 3 are provided with the reflective elements R1 and R2 between two diffraction gratings, respectively.

The reflective element R1 reflects one of the two light beams split by the diffraction grating GBS11. The reflective element R2 reflects the other of the two light beams. In other words, the reflective element R1 reflects the light beam from the diffraction grating GBS12 that is a reflective diffraction grating to the diffraction grating GBS14 that is a reflective diffraction grating. The reflective element R2 reflects the light beam from the diffraction grating GBS11 that is a transmissive diffraction grating to the diffraction grating GBS13 that is a transmissive diffraction grating.

As shown in FIG. 9, in the wavelength shift detection sensor WLCD3, the optical path length difference of the two light beams is, similarly to the case of the wavelength shift detection sensor WLCD2 of Embodiment 2, twice as long as the interval (gap G) of the spacer member SP.

Interference light is generated by synthesizing the reflected light by the reflective element R1 and the reflected light by the reflected element R2 in the diffraction grating GBS13 that is a first diffraction grating to be emitted to the photoelectric sensor PD. In the wavelength shift detection sensor WLCD3 in the present embodiment, the interference light (received light) is emitted to the same side as that of incident light. Therefore, the photoelectric sensor PD is provided at the incident light side (the same side as that of the beam splitter BS1).

The diffraction grating GBS13 is, similarly to the diffraction grating GBS4 of Embodiment 2, split into four regions. In the present embodiment, similarly to the case of Embodiment 2, based on the light beams (interference signal) emitted from the four regions, a phase shift $\Delta\phi$ and a wavelength shift $\Delta\lambda$ of a light beam are represented by the expressions (1) and (1'), respectively.

In the present embodiment, both of the diffraction gratings GBS11 and GBS13 formed on the glass substrate G11 are transmissive diffraction gratings. Both of the diffraction gratings GBS12 and GBS14 formed on the glass substrate G12 are reflective diffraction gratings. Although the wavelength shift detection sensor WLCD3 is made by the same manufacturing method as that of Embodiment 2, the transmissive diffraction grating and the reflective diffraction grating are strictly different in a microstructure such as a step. Therefore, according to the present embodiment, forming the diffraction grating structure is easier than that of Embodiment 2.

As described above, because the wavelength shift measuring apparatus of the present embodiment is also configured to hold the optical path length difference of the two light beams stably constant, the wavelength shift of the light source can be measured with high accuracy.

Next, the configuration of an exposure apparatus in the embodiment of the present invention will be described. Any wavelength shift measuring apparatus of Embodiments 1 to 3 described above can be applicable to the exposure apparatus described later.

Figure 10:
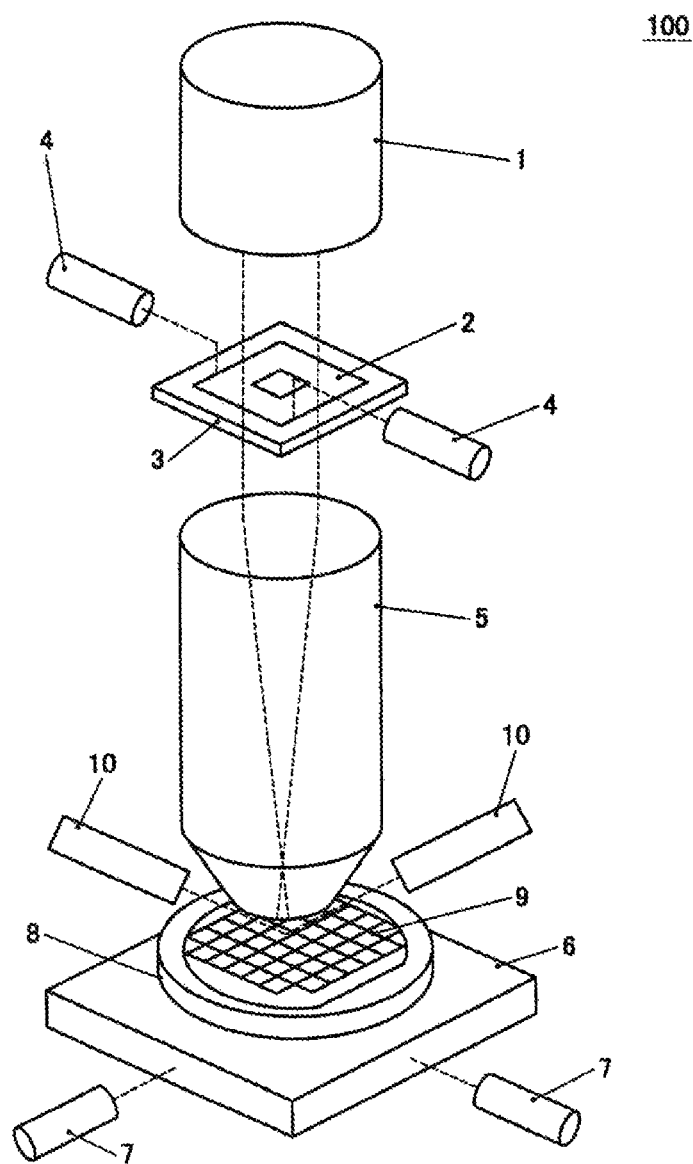
FIG. 10 is a schematic configuration diagram of an exposure apparatus of the present embodiment.

FIG. 10 is a schematic configuration diagram of an exposure apparatus 100 in the present embodiment. The exposure apparatus 100 includes the interference measuring apparatus (wavelength shift measuring apparatus) described above.

Reference numeral 1 denotes an illumination apparatus. The illumination apparatus 1 constitutes an illumination optical system which illuminates a pattern of a reticle (original plate), and includes a light source and a shutter (not shown) inside it. Reference numeral 2 denotes a reticle (original plate). A circuit pattern is depicted on the reticle 2. The circuit pattern formed on the reticle 2 is projected onto a wafer 9 by illuminating light on the reticle 2 using the illumination apparatus 1.

Reference numeral 3 denotes a reticle stage (first stage). The reticle stage 3 is provided for mounting the reticle 2 on it to move the reticle 2. Reference numeral 4 denotes a reticle position measuring portion (interference measuring apparatus). The reticle position measuring portion 4 measures a position of the reticle 2 mounted on the reticle stage 3 (a position of the reticle stage 3). Reference numeral 5 denotes a projection exposure lens. The projection exposure lens 5 constitutes a projection optical system for exposure and projects the pattern of the reticle 2 onto the wafer (substrate).

Reference numeral 6 denotes a wafer stage (second stage). The wafer stage 6 mounts the wafer 9 (substrate) to be exposed and moves in an in-plane direction of the wafer 9 (x and y directions).

Reference numeral 7 denotes a laser interferometer (interference measuring apparatus) and measures a position of the wafer stage 6. Reference numeral 8 denotes a wafer chuck and it absorbs and holds the wafer 9. Reference numeral 10 denotes an auto focus unit and it measures a focal position of the wafer 9.

As described above, the exposure apparatus 100 of the present embodiment includes the interference measuring apparatus which measures at least one of the positions of the reticle stage 3 and the wafer stage 6. The interference measuring apparatus is provided with the wavelength shift measuring apparatus described above.

A device (a semiconductor integrated circuit device, a liquid crystal display device, or the like) is manufactured by a process of exposing a substrate (a wafer, a glass plate, or the like) to which a photosensitizing agent is applied using an exposure apparatus in the above embodiments, a process of developing the substrate, and other well-known processes.

As described above, since the present embodiment includes a configuration where an optical path length difference of two light beams is stably constant, only a shift of the light source wavelength can be measured. Therefore, a highly-accurate wavelength shift measuring apparatus, light source apparatus, interference measuring apparatus, and exposure apparatus can be provided. Further, according to the present embodiment, a method for manufacturing a device using the above exposure apparatus can be provided.

According to the present embodiment, a highly-accurate and stable measuring apparatus can be realized by only adding an inexpensive and simple optical system and by detecting a shift of a light source wavelength to correct a measured value.

For example, for the measurement of the wavelength shift, a light beam having a wavelength of 850 nm enters a Michelson interferometer in which an optical path length difference of two light beams is fixed to 10 mm. When an interference phase shift is measured with a resolution of 1/4096 period, a wavelength shift of 0.018 pm can be measured. In this case, when the optical path length difference of the two light beams is 5 mm in a main interference measuring apparatus, the measured value can be corrected with a step of 0.1 nm. Therefore, even if the light source wavelength varies, an error of the measured value can be reduced to 0.1 nm or less.

A wavelength shift measuring apparatus in the present embodiment is also applicable to an industrial machine stage which needs to detect a subnanometer displacement, a highly-accurate shape measuring apparatus, a microscope stage, a highly-accurate machining apparatus, a semiconductor manufacturing apparatus, and the like. Further, a wavelength shift sensor is singularly applicable to an apparatus which measures a wavelength shift caused by change of the passage of time of a laser diode to predict its lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-274213, filed on Oct. 24, 2008, and Japanese Patent Application No. 2009-223435, filed on Sep. 28, 2009, which are hereby incorporated by reference herein in its entirety.

What is claimed is:

1. A wavelength shift measuring apparatus which measures a shift of a wavelength of a light beam emitted from a light source relative to an initial wavelength of the light beam, the wavelength shift measuring apparatus comprising:
    an optical system configured to split the light beam emitted from the light source into two light beams and to cause the two light beams to interfere with each other to generate a plurality of interference light beams having phases different from each other,
    wherein the optical system includes diffraction gratings and a spacer separating the diffraction gratings by a spacing to provide a predetermined difference between an optical path length of one of the two light beams and an optical path of the other of the two light beams;
    a plurality of photoelectric sensors configured to respectively detect the plurality of interference light beams generated by the optical system; and
    a processor configured to output a shift of the wavelength based on outputs from the plurality of photoelectric sensors.

2. The wavelength shift measuring apparatus according to claim 1, wherein:
    the optical system includes a first diffraction grating, among the diffraction gratings, configured to generate the two light beams and a second diffraction grating, among the diffraction gratings, facing the first diffraction grating, and configured to combine the two light beams generated by the first diffraction grating, and
    the spacer member provides the spacing between the first diffraction grating and the second diffraction grating.

3. The wavelength shift measuring apparatus according to claim 2, wherein the second diffraction grating includes a plurality of diffraction gratings, the combined two light beams being generated via each of the plurality of diffraction gratings to generate corresponding one of the plurality of interference light beams.

4. The wavelength shift measuring apparatus according to claim 1, wherein:
    the optical systems includes a first member including a first diffraction grating, among the diffraction gratings, configured to generate the two light beams, and a second diffraction grating, among the diffraction gratings, and a first reflective element, and a second member including a third diffraction grating, among the diffraction gratings, a fourth diffraction grating, among the diffraction gratings, and a second reflective element, the second member facing the first member, one of the two light beams being diffracted by the third diffraction grating, reflected by the first reflective element, diffracted by the fourth diffraction grating, and then transmitted by the second diffraction grating, and the other of the two light beams being reflected by the second reflective element and then diffracted by the fourth diffraction grating, the two light beams that exit the fourth diffraction grating being combined to interfere with each other,
    the spacer provides the spacing between the first member and the second member.

5. The wavelength shift measuring apparatus according to claim 4, wherein the fourth diffraction grating includes a plurality of diffraction gratings, the combined two light beams being generated via each of the plurality of diffraction gratings to generate corresponding one of the plurality of interference light beams.

6. The wavelength shift measuring apparatus according to claim 1, wherein the spacer is arranged to allow clear optical paths of the two light beams.

7. The wavelength shift measuring apparatus according to claim 1, wherein the spacer includes a transmissive substrate, and the diffraction gratings are respectively arranged on both surfaces of the transmissive substrate without an adhesive.

8. A light source apparatus which emits a coherent light beam, the light source apparatus comprising:
    a light source configured to emit the light beam;
    splitter configured to split the light beam emitted from the light source;
    a wavelength shift measuring apparatus configured to receive a light beam split by the splitter and measure a shift of a wavelength of the light beam relative to an initial wavelength of the light beam; and
    a controller configured to control the light source reduce the wavelength shift of the light beam emitted from the light source based on an output from the wavelength shift measuring apparatus,
    wherein the wavelength shift measuring apparatus comprises:
    an optical system configured to split the received light beam into two light beams and to cause the two light beams to interfere with each other to generate a plurality of interference light beams having phases different from each other,
    wherein the optical system includes diffraction gratings and a spacer separating the diffraction gratings by a spacing to provide a predetermined difference between an optical path length of one of the two light beams and an optical path of the other of the two light beams;
    a plurality of photoelectric sensors configured to respectively detect the plurality of interference light beams generated by the optical system; and
    a processor configured to output a shift of the wavelength based on outputs from the plurality of photoelectric sensors.

9. An interference measuring apparatus which measures a displacement of an object, the interference measuring apparatus comprising:
- a light source configured to emit a coherent light beam;
- an interference measuring portion configured to receive a part of the light beam emitted from the light source, and to measure the displacement of the object; and
- a wavelength shift measuring apparatus configured to receive another part of the light beam emitted from the light source,
- wherein the interference measuring portion is configured to measure the displacement based on an output from the wavelength shift measuring apparatus, and
- wherein the wavelength shift measuring apparatus comprises:
- an optical system configured to split the received light beam into two light beams and to cause the two light beams to interfere with each other to generate a plurality of interference light beams having phases different from each other,
- wherein the optical system includes diffraction gratings and a spacer separating the diffraction gratings by a spacing to provide a predetermined difference between an optical path length of one of the two light beams and an optical path of the other of the two light beams;
- a plurality of photoelectric sensors configured to respectively detect the plurality of interference light beams generated by the optical system; and
- a processor configured to output a shift of the wavelength based on outputs from the plurality of photoelectric sensors.

10. An exposure apparatus which exposes a substrate to a pattern, the exposure apparatus comprising:
- a stage on which the substrate or another object is mounted, configured to be moved; and
- an interference measuring apparatus configured to measure a position of the stage,
- wherein the interference measuring apparatus includes:
- a light source configured to emit a coherent light beam;
- an interference measuring portion configured to receive a part of the light beam emitted from the light source, and to measure the displacement of the object; and
- a wavelength shift measuring apparatus configured to receive another part of the light beam emitted from the light source,
- wherein the interference measuring portion is configured to measure the displacement based on an output from the wavelength shift measuring apparatus, and
- wherein the wavelength shift measuring apparatus comprises:
- an optical system configured to split the received light beam into two light beams and to cause the two light beams to interfere with each other to generate a plurality of interference light beams having phases different from each other,
- wherein the optical system includes diffraction gratings and a spacer separating the diffraction gratings by a spacing to provide a predetermined difference between an optical path length of one of the two light beams and an optical path of the other of the two light beams;
- a plurality of photoelectric sensors configured to respectively detect the plurality of interference light beams generated by the optical system; and
- a processor configured to output a shift of the wavelength based on outputs from the plurality of photoelectric sensors.

11. A device manufacturing method comprising the steps of:
- exposing a substrate to a pattern using an exposure apparatus; and
- developing the exposed substrate,
- wherein the exposure apparatus comprises:
- a stage on which the substrate or another object is mounted, and configured to be moved; and
- an interference measuring apparatus configured to measure a position of the stage,
- wherein the interference measuring apparatus comprises:
- a light source configured to emit a coherent light beam;
- an interference measuring portion configured to receive a part of the light beam emitted from the light source, and to measure the displacement of the object; and
- a wavelength shift measuring apparatus configured to receive another part of the light beam emitted from the light source,
- wherein the interference measuring portion is configured to measure the displacement based on an output from the wavelength shift measuring apparatus, and
- wherein the wavelength shift measuring apparatus comprises:
- an optical system configured to split the received light beam into two light beams and to cause the two light beams to interfere with each other to generate a plurality of interference light beams having phases different from each other,
- wherein the optical system includes diffraction gratings and a spacer separating the diffraction gratings by a spacing to provide a predetermined difference between an optical path length of one of the two light beams and an optical path of the other of the two light beams;
- a plurality of photoelectric sensors configured to respectively detect the plurality of interference light beams generated by the optical system; and
- a processor configured to output a shift of the wavelength based on outputs from the plurality of photoelectric sensors.

* * * * *